United States Patent [19]

Veltrop et al.

[11] Patent Number: 4,902,931
[45] Date of Patent: Feb. 20, 1990

[54] METHOD AND ARRANGEMENT FOR MECHANICALLY MOVING OF A MAGNETIC FIELD GENERATING DEVICE IN A CATHODE ARC DISCHARGE EVAPORATING DEVICE

[75] Inventors: Hans Veltrop, Grubbenvorst; Harald Wesemeyer, Wiehl; Boudewijn J. A. M. Buil, Belfeld; Simon Boelens, Venlo, all of Netherlands

[73] Assignee: Hauzer Holding B.V., Pa Venlo, Netherlands

[21] Appl. No.: 168,439

[22] Filed: Mar. 15, 1988

[30] Foreign Application Priority Data

Mar. 16, 1987 [NL] Netherlands ............ 8700619
Mar. 16, 1987 [NL] Netherlands ............ 8700621

[51] Int. Cl.⁴ .................................. H01J 1/50
[52] U.S. Cl. ........................... 315/326; 315/111.41
[58] Field of Search ............. 315/326, 111.1, 111.41, 315/111.61; 313/231.51; 204/192.38, 298; 118/50.1, 723, 726, 727, 728, 729, 730, 733; 427/37, 47

[56] References Cited

FOREIGN PATENT DOCUMENTS 0002623 6/1979 European Pat. Off. .
2148049 5/1985 United Kingdom .
2163458 2/1986 United Kingdom .
8503954 9/1985 World Int. Prop. O. .

OTHER PUBLICATIONS

*Soviet Inventions Illustrated,* week B20, 20 Juni 1979, Samenvatting 38405B/20.
*Soviet Inventions Illustrated,* week CO3, 27 Februari 1980, Samenvatting 04929C/03.
Soviet Inventions Illustrated; Week D15, 20 mei 1981, Samenvatting 26616D/15 M12x25.

*Primary Examiner*—David Mis
*Attorney, Agent, or Firm*—Harness, Dickey & Pierce

[57] ABSTRACT

A method and device are provided to prevent grooves from occurring on a cathode surface of a cathode arc discharge evaporating device by adding a second movement to a first rotational movement of a magnetic field generator within the device, which enables the arc spot to scan a substantial portion of the cathode surface.

18 Claims, 3 Drawing Sheets

METHOD AND ARRANGEMENT FOR MECHANICALLY MOVING OF A MAGNETIC FIELD GENERATING DEVICE IN A CATHODE ARC DISCHARGE EVAPORATING DEVICE

The present invention relates to a method for mechanically moving a magnetic field generating device along a path near a cathode plate, said movement comprising a base rotation. Such a device is known from WO-A-85/03954 in which a magnetic field generating device is mechanically rotated. Although the axis of the magnetic field generating device does not coincide with the axis of rotation the arc controlled by this magnetic field generating device will follow a substantially circular path. Because of this only along said circular path material of the target cathode will evaporate to the substrate. This means that the cathode might be used (eroded) along said circular path, whilst on other spots of said cathode sufficient material is left. In other words the target surface is very unevenly used.

The invention aims to obviate this drawback and to provide a method by which it is possible to more evenly use the target surface. According to the invention this is realized in that to the base rotation a further movement is added. This movement can comprise all movements known in the art, but preferably this movement is a further rotational movement having an amplitude being smaller than that of said base rotation. It is also preferred to have such further movement that the magnetic field generating device follows a spiral-like path.

It is remarked that from GB-A-2,163,458 it is known to have a magnetic field describing a spiral-like path. However, this spiral-like path is realized without any mechanical means. In the embodiment according to the British specification only coils are used. This is a considerable drawback because by controlling said coils first of all the spiral-like movement has to be obtained and furthermore the magnetic field has also to be optimal in the sense of controlling the arc spot movement. It is of course not possible to optimalize both requirements with one magnetic field generating device only. By using the mechanically controlled magnetic field generating device according to the invention both functions have been separated and each can be optimized as such, so that it is possible to obtain maximum results in both controlling the movement of the magnetic field generating device and controlling the arc spot on the target surface.

It has been found that at describing a spiral-like movement the same lingering period is obtained if the radius vector of a point on the spiral is about proportional to the square root of the angle of the radius vector, in other words $\rho = a\sqrt{\phi} + b$. In this expression $\rho$ is the length of the radius with regard to the center and $\phi$ the angle. To prevent the erosion of the target becoming more considerable in the centre of the cathode than near its edge, optimum results are obtained if $\rho = a\phi^{\frac{1}{x}} + b$, wherein $2 \leq x \leq 2.5$. To prevent a more considerable erosion in the centre of the cathode than at its edge, the magnetic field has to move much faster near the centre than at its edge. To vary the speed of the movement with the distance from the centre to keep the lingering time of the arc as constant as possible $\rho$ is a higher order goniometric function, e.g. $\rho = f(\phi)t$. Besides this spiral-like movement, the magnetic field can also describe a further periodical movement substantially perpendicular to the target surface. This can comprise rotation in a magnetic field being not rotational symmetric.

The invention also relates to an arrangement for carrying out the method as described above, more particular being able to perform a base rotation to which a further rotation, having a smaller amplitude, is added. This arrangement comprises a magnetic field generating device moveable with regard to the cathode plate of a cathode arc evaporation device eccentrically arranged with regard to the center of a gear, which can carry out said further rotational movement, said gear being in engagement with a gear ring, being able to perform the base rotation. By having both gear independently drivable all places on the cathode surface can be touched by the arc such that the cathode can be consumed evenly. A preferred means for controlling the drives of both gears comprises a microprocessor means. An arrangement for carrying out above method wherein a spiral-like path is described by the magnetic field generating device comprises according to a preferred embodiment a base plate having a spiral-like groove and a support member having slidable arranged pin means, being engageable in said grooves, being connected with said magnetic field generating device. This base plate can also be rotatable. According to a preferred embodiment this base plate is arranged rotatably in a sense opposite to the sense of movement of the support member. By this it is possible to have the arc spot describe several times a spiral-like path over the cathode surface. Said spiral-like path being different everytime.

The magnetic field generating device can comprise electromagnetic coils possibly controlled by microprocessor means. These coils can perform a modulating movement of the arc trajectory.

The invention will be further elucidated with reference to embodiments described below which are given as example only and shown in the drawing, in which.

Figure 1:
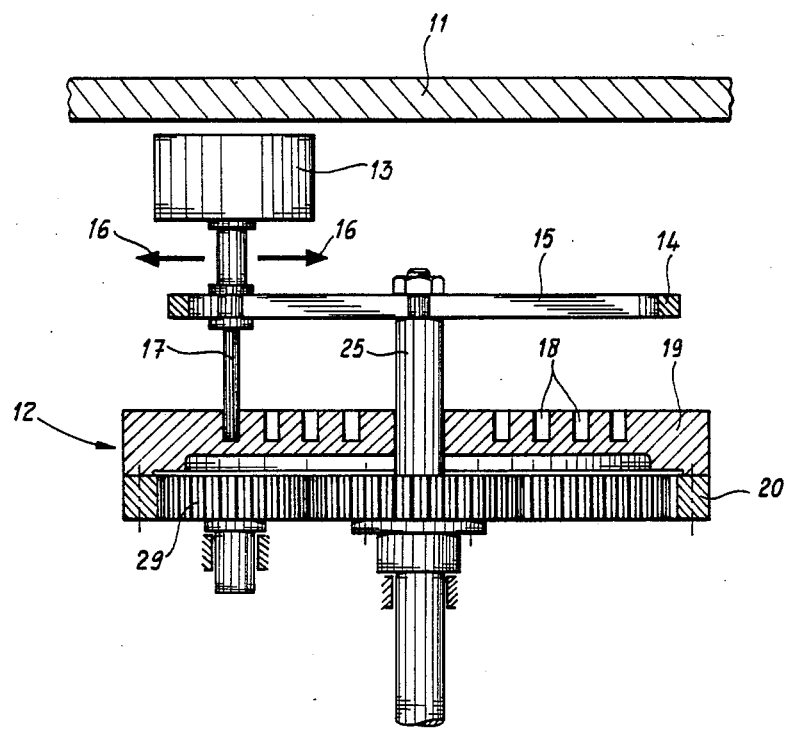
FIG. 1 shows a detail of an cathode arc evaporating arrangement provided with magnetic field generating means, being moveable along a spiral-like path.
Figure 3:
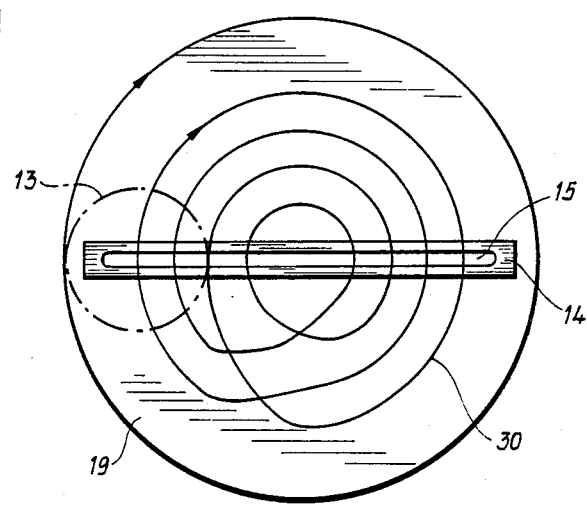
FIG. 3 shows the path described by the magnetic field generating device for carrying out the method according to the invention.

In FIG. 1 an arrangement is shown for mechanically moving a magnetic field generating device 13. This arrangement can be incorporated in the device according to WO-A-85/03954 which is incorporated by reference. In FIG. 1 the cathode plate is referred to with 11 and comprises material to be evaporated. For the substrate on which the material has to be deposited, or the anode reference is made to above WO-publication. However, it is of importance that the arc being drawn between the anode (not shown) and cathode plate 11 describes such a path over the cathode plate 11, that it is consumed as evenly as possible. To this end under cathode plate 11 at the site removed from the substrate to be processed, an arrangement is shown generally referred to with 12, comprising a magnetic field generating device 13 as well as means for describing a spiral-like path for the magnetic field generating device. This means comprise a rotating slide rail 14, in which the magnetic field generating device can be moved to and fro through a slot 15 (shown in FIG. 3) in the direction of arrow 16. Pin 17 of the magnetic field generating member fits in a spiral-like groove 18 provided in base plate 19. This base plate can be stationary, but in the embodiment shown it is connected with drive means 29 through the gear 20. By relative movement of the rotating slide rail 14 and base plate 19 different paths can be obtained, of which as an example path 30 is shown in FIG. 3. It is clear that a spiral-like movement is described, wherein the surface of the cathode plate 11 is described as evenly as possible. Through the inward and outward movement of the magnetic field generating member by changing the relative movement of rotation of the slide rail 14 and base plate 19, all of the cathode surface can be subsequently scanned with different kinds of spiral-like paths.

Figure 2:
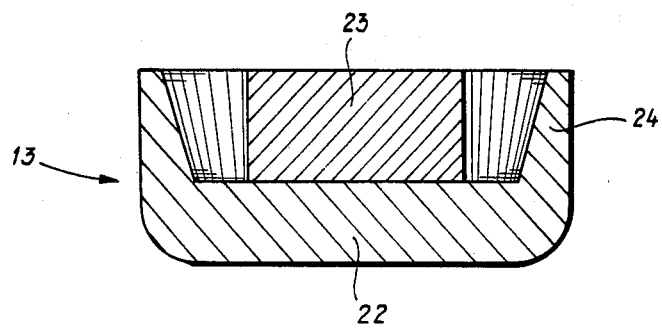
FIG. 2 shows a detail of the magnetic field generating device from FIG. 1.

In FIG. 2 an example of a magnetic field generating member is shown. It comprises a soft iron part 22 and a ring pole 24 being integral and permanent magnet 23, the poles 23 and 24 having opposite polarity. Magnet 23 can comprise an assembly of different poles. It has to be understood that this is only an example and that it is possible to embody the magnetic field generating device as electromagnets or a combination of electromagnets and permanent magnets.

Figure 4:
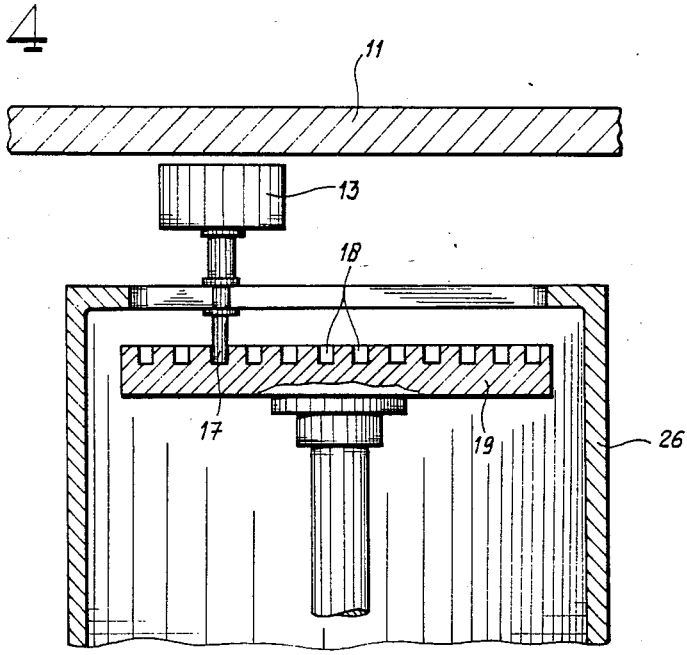
FIG. 4 shows a cross-section of a further embodiment of the arrangement shown in FIG. 1

In FIG. 4 a further embodiment is shown in which the drawback has been removed that the magnetic field generating device 13 cannot be moved beyond the center of the cathode plate 11. As is clear in FIG. 1 shaft 25 obstructs any further movement of the magnetic field generating device 13 to the center of the cathode plate 11. In the embodiment according to FIG. 4 the rotating slide rail is embodied as rotating cylindrical sleeve 26 being provided with a slot in the way shown in FIG. 3. Now it is possible to provide the base plate 19 of a groove 18 extending through said plate 19. Also in this embodiment it is possible to use for magnetic field generating device 13 all magnets and magnets assemblies both permanent and electrical being known in the art. If electrical magnets are used all means known in the art for controlling them can be used, more particular microprocessors.

Figure 5:
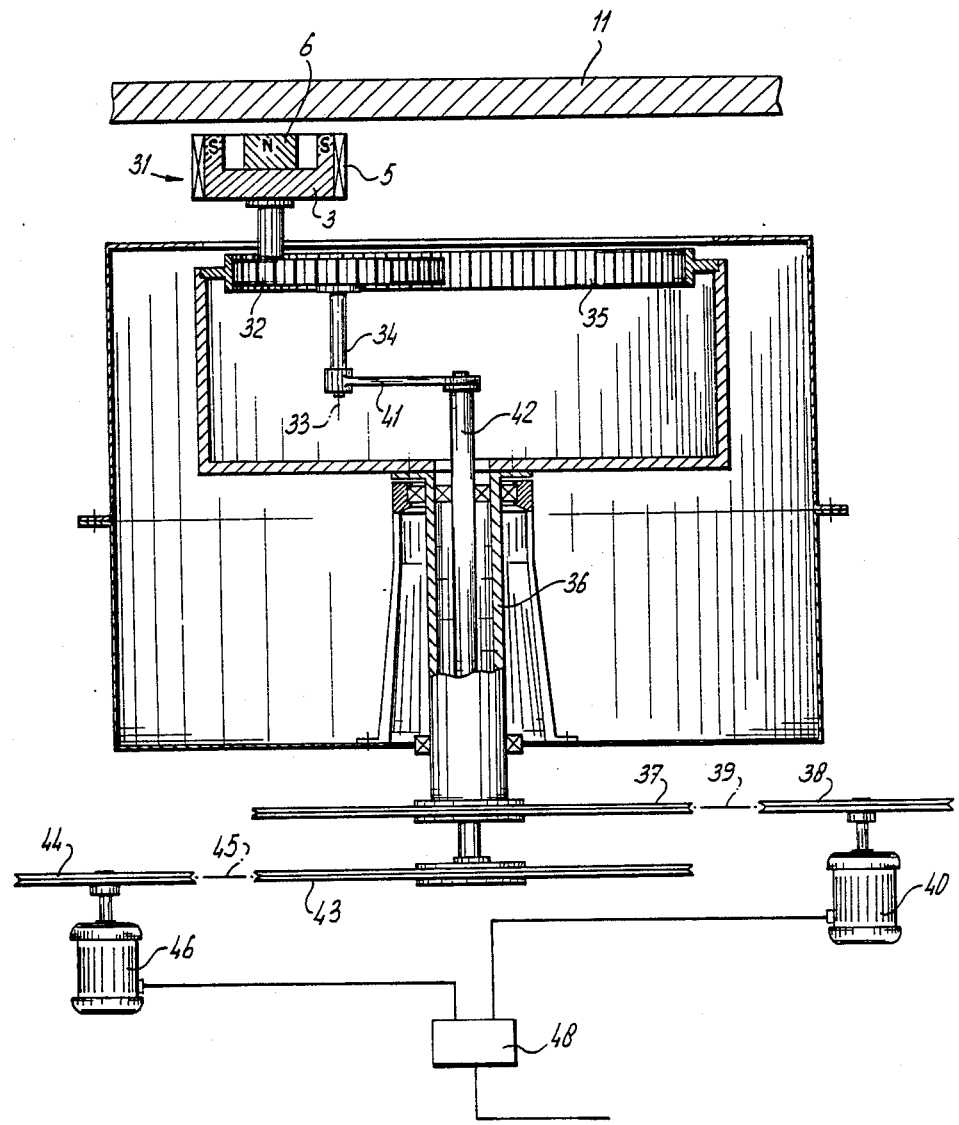
FIG. 5 shows an embodiment in which another kind of movement is realized for the magnetic field generating device.

In FIG. 5 another arrangement is shown for moving a magnetic field generating device, in this FIGURE indicated with 31. In the arrangement according to the FIG. 5 embodiment, magnetic field generating device 31 is mounted on gear wheel 32 excentrically with regard to the axis 33 of this gear wheel 32. Gear wheel 32 can rotate around shaft 34 and engages ring gear 35. Ring gear 35 is connected through sleeve 36 pulleys 37, 38 and belt 39 with motor drive 40. Gear wheel 32 is connected through arm 41, shaft 42, pulleys 43 and 44 and belt 45 with motor 46. When motor 46 is blocked and motor 40 drives ring gear 35, magnetic field generating device 31 will perform a rotation around axis 33. When ring gear 35 is blocked and motor 46 is driven magnetic field generating device 31 will describe a movement comprising a combination of a base rotation (described by axis 33) and further rotation around axis 33. When driving both motors 46 and 40 simultaneously or intermittently in the same or opposite directions many kinds of movements are possible. Controlling of the motors is preferably realized by a microprocessor means schematically referred to with 48. The magnetic field generating device 31 according to FIG. 5 comprises an electromagnetical coil 5 surrounding a soft iron piece 3. In the centre of the soft iron piece a permanent magnet 6 is provided having e.g. its north pole as shown in the figure.

By using one of the embodiments shown above the arc controlled by the magnetic field generating device will not only describe a circular path but added to this movement a further path. By this, groove-like erosion of only a limited portion of cathode plate 11 is obviated. Although the embodiments shown are preferred embodiments, it will be clear to a person skilled in the art that many modifications and other embodiments can be realized in which a further movement is added to a circular movement. It is envisaged that all these embodiments are within the scope of protection as described in the following claims.

I claim:

1. Method for mechanically moving a magnetic field generating device along a path near a cathode plate comprising:
    rotating said magnetic field generating device relative to said cathode plate according to a first rotational movement;
    simultaneously moving said magnetic field generating device according to a second movement; and
    wherein said path created by said first and second movements creates an erosion pattern over a substantial portion of said cathode plate.

2. Method according to claim 1, wherein said second movement of said magnetic field generating device is a rotational movement having an amplitude smaller than that of said first rotational movement.

3. Method according to claim 1, wherein said second movement of said magnetic field generating device is a linear movement changing the amplitude of said first rotational movement in such a way that said path is a spiral.

4. Method according to claim 3, wherein the radius vector on the spiral is substantially proportional with the square root of the angle of the radius vector.

5. Method according to claim 3, wherein said spiral satisfies $\rho = a\phi^{\frac{1}{x}}$ in which $2 \leq x \leq 2.5$, $\rho$ and $\phi$ being polycoordinates and $\phi$ being a function of time.

6. Method according to claim 3, wherein the rate of the movement of the magnetic field near the center of the spiral is larger than at the outer end of said spiral.

7. Method according to claim 6, characterized in that the rate of the movement is determined according to the amplitude of a goniometric function.

8. Method according to claim 1, wherein the perpendicular component of a magnetic field created by said magnetic field generating device describes a further periodic movement substantially perpendicular to a target surface, by which a cathode arc trajectory is changed.

9. Method according to claim 5, wherein the rate of said spiral is determined by a higher order function.

10. Method according to claim 1, further comprising rotating said magnetic field generating device around its axis.

11. Arrangement for carrying out the method according to claim 3 comprising a base plate having a spiral-like groove and a support member being rotatable with respect to the base plate having pin means being slidable engageable in said groove and being connected with the magnetic field generating device.

12. Device according to claim 11, wherein the base plate is rotatably in a direction opposite to the direction of movement of said support member.

13. Arrangement for carrying out the method according to claim 11, wherein the magnetic field generating device comprises electromagnetic coils and a control circuitry.

14. Arrangement according to claim 13 wherein said coils can be modulated.

15. Arrangement according to claim 13, wherein said control circuitry is embodied in a microprocessor.

16. Arrangement for mechanically moving a magnetic field generating device along a path near a cathode plate by means of first and second rotational movements, comprising a magnetic field generating device moveable with regard to a cathode plate of a cathode arc evaporizing device, arranged eccentrically with regard to the axis of a gear, being able to carry out said second rotation movement, said gear being engagable with a gear ring, being able to carry out the second rotation movement.

17. Arrangement according to claim 16, wherein said gears are independently drivable.

18. Arrangement according to claim 16 comprising microprocessor means for controlling the drive of the gears.

* * * * *